(12) United States Patent
Claessens et al.

(10) Patent No.: US 11,168,410 B2
(45) Date of Patent: Nov. 9, 2021

(54) SUSCEPTOR FOR A CHEMICAL VAPOUR DEPOSITION REACTOR

(71) Applicant: AIXTRON SE, Herzogenrath (DE)

(72) Inventors: Daniel Claessens, Aachen (DE); Adam Boyd, Kelmis (BE); James O'Dowd, London (GB); Olivier Feron, Gemmenich (BE)

(73) Assignee: AIXTRON SE, Herzogenrath (DE)

( * ) Notice: Subject to any disclaimer, the term of this patent is extended or adjusted under 35 U.S.C. 154(b) by 159 days.

(21) Appl. No.: 16/327,298

(22) PCT Filed: Aug. 22, 2017

(86) PCT No.: PCT/EP2017/071152
§ 371 (c)(1),
(2) Date: Feb. 21, 2019

(87) PCT Pub. No.: WO2018/037014
PCT Pub. Date: Mar. 1, 2018

(65) Prior Publication Data
US 2019/0194820 A1    Jun. 27, 2019

(30) Foreign Application Priority Data

Aug. 23, 2016 (DE) .................... 10 2016 115 614.0

(51) Int. Cl.
*C23C 16/458* (2006.01)
*H01L 21/687* (2006.01)
*C30B 25/12* (2006.01)

(52) U.S. Cl.
CPC .......... *C30B 25/12* (2013.01); *C23C 16/4585* (2013.01); *H01L 21/6875* (2013.01); *H01L 21/68735* (2013.01); *H01L 21/68771* (2013.01)

(58) Field of Classification Search
CPC ........... C23C 16/4585; H01L 21/68735; H01L 21/6875; H01L 21/68771; C30B 25/12
(Continued)

(56) References Cited

U.S. PATENT DOCUMENTS 3,993,018 A * 11/1976 Kranik ..................... B05C 11/08
                                                                        118/52
5,447,570 A * 9/1995 Schmitz ................... C23C 16/04
                                                                       118/715
(Continued)

FOREIGN PATENT DOCUMENTS

| CN | 103258763 A | 8/2013 |
| CN | 103898478 A | 7/2014 |

(Continued)

OTHER PUBLICATIONS

International Search Report dated Jan. 25, 2018, from the ISA/European Patent Office, for International Patent Application No. PCT/EP2017/071152 (filed Aug. 22, 2017), 9 pages.
(Continued)

*Primary Examiner* — Charlee J. C. Bennett
(74) *Attorney, Agent, or Firm* — Ascenda Law Group, PC

(57) ABSTRACT

A susceptor for a CVD-reactor includes insertion openings arranged in a bearing surface of the susceptor. An insertion section of a positioning element is inserted into one of the insertion openings. The insertion section forms positioning flanks with a section projecting from the insertion opening for fixing the position of a substrate. The insertion openings each have side walls and a base. The insertion section comprises bearing areas adjacent to the side walls of the insertion openings and a lower side of the positioning element facing the base of the insertion opening. The base of the insertion opening is separated from the lower side of the positioning element by a first distance. An edge protruding section of the positioning element is separated from a
(Continued)

section of the bearing surface of the susceptor by a second distance.

18 Claims, 18 Drawing Sheets

(58) Field of Classification Search
USPC .......................................................... 118/728
See application file for complete search history.

(56) References Cited

U.S. PATENT DOCUMENTS

| | | | | |
|---|---|---|---|---|
| 5,474,612 | A * | 12/1995 | Sato | C23C 16/45521 |
| | | | | 118/725 |
| 5,782,979 | A * | 7/1998 | Kaneno | C23C 16/301 |
| | | | | 118/500 |
| 5,840,124 | A * | 11/1998 | Gurary | C23C 16/4585 |
| | | | | 118/726 |
| 6,001,183 | A * | 12/1999 | Gurary | C23C 16/4584 |
| | | | | 118/720 |
| 6,030,509 | A * | 2/2000 | Fu-Kang | C23C 16/4585 |
| | | | | 118/504 |
| 9,988,712 | B2 * | 6/2018 | Sufan | H01L 21/6875 |
| 2004/0011293 | A1 * | 1/2004 | Johnson | H01L 21/68735 |
| | | | | 118/728 |
| 2005/0183829 | A1 * | 8/2005 | Goodman | C23C 16/4581 |
| | | | | 156/345.51 |
| 2008/0006668 | A1 | 1/2008 | Nowacki et al. | |
| 2010/0162957 | A1 * | 7/2010 | Boyd | C23C 16/4583 |
| | | | | 118/725 |
| 2012/0003822 | A1 | 1/2012 | Ueno et al. | |
| 2012/0014619 | A1 | 1/2012 | Tobita | |
| 2012/0156374 | A1 * | 6/2012 | Gurary | H01L 21/68771 |
| | | | | 427/255.28 |
| 2013/0276704 | A1 * | 10/2013 | Krishnan | C23C 16/4584 |
| | | | | 118/725 |
| 2017/0260624 | A1 * | 9/2017 | Sufan | H01L 21/68735 |
| 2017/0352575 | A1 * | 12/2017 | Gangakhedkar | |
| | | | | H01L 21/68735 |

FOREIGN PATENT DOCUMENTS

| | | |
|---|---|---|
| DE | 10043600 A1 | 3/2002 |
| DE | 10323085 A1 | 12/2004 |
| DE | 102007023970 A1 | 12/2008 |
| DE | 102011056589 A1 | 1/2013 |
| DE | 102012108986 A1 | 3/2014 |
| DE | 102013114412 A1 | 6/2015 |
| DE | 102014100024 A1 | 7/2015 |
| DE | 102015118215 A1 | 6/2016 |
| DE | 102015113956 A1 | 3/2017 |

OTHER PUBLICATIONS

Written Opinion dated Jan. 25, 2018, from the ISA/European Patent Office, for International Patent Application No. PCT/EP2017/071152 (filed Aug. 22, 2017), 11 pages.

Written Opinion dated Jan. 25, 2018, from the ISA/European Patent Office, for International Patent Application No. PCT/EP2017/071152 (filed Aug. 22, 2017), English translation, 10 pages.

International Preliminary Report on Patentability dated Feb. 26, 2019, from the International Bureau of WIPO, for International Patent Application No. PCT/EP2017/071152 (filed Aug. 22, 2017), 23 pages.

* cited by examiner

Fig. 3
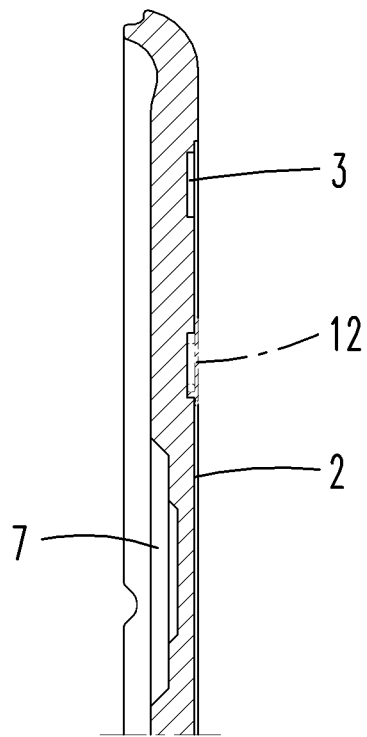
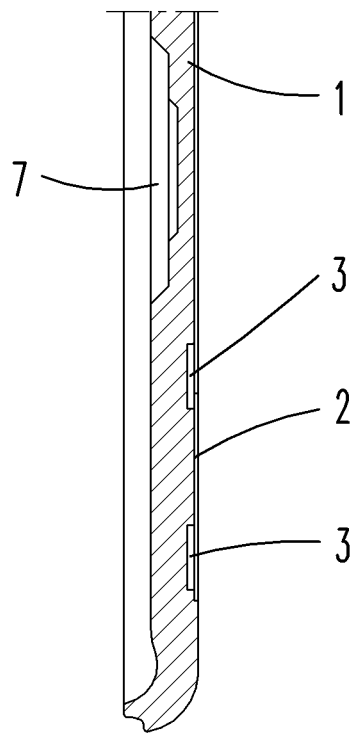

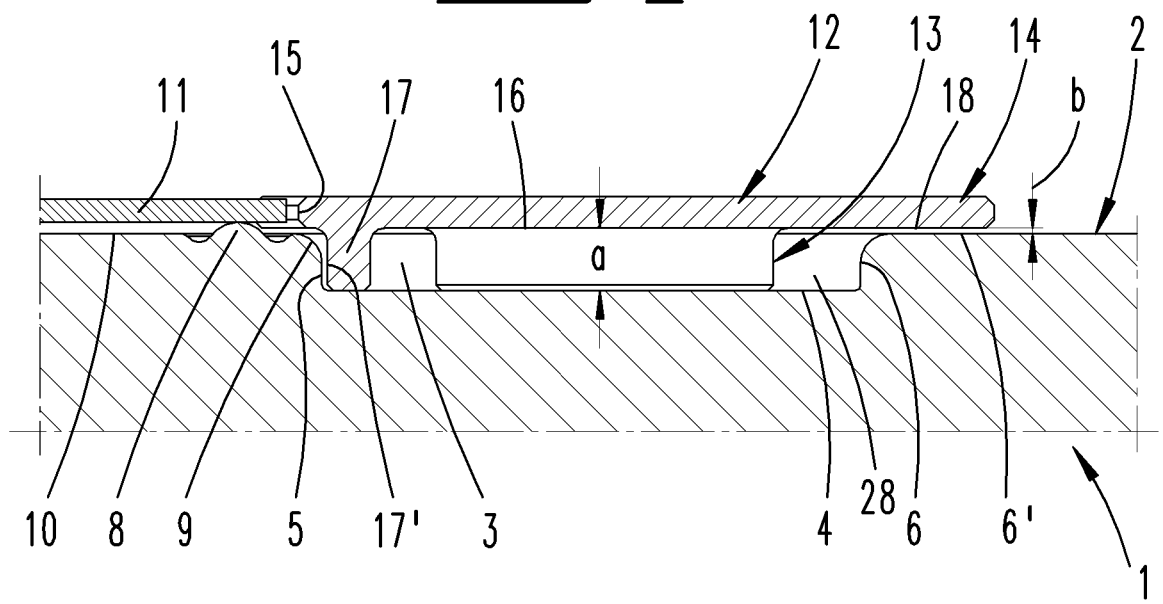
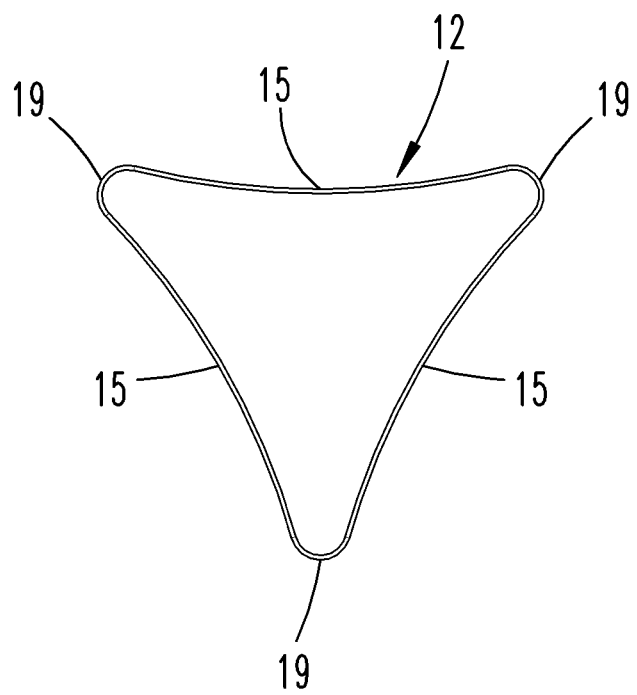

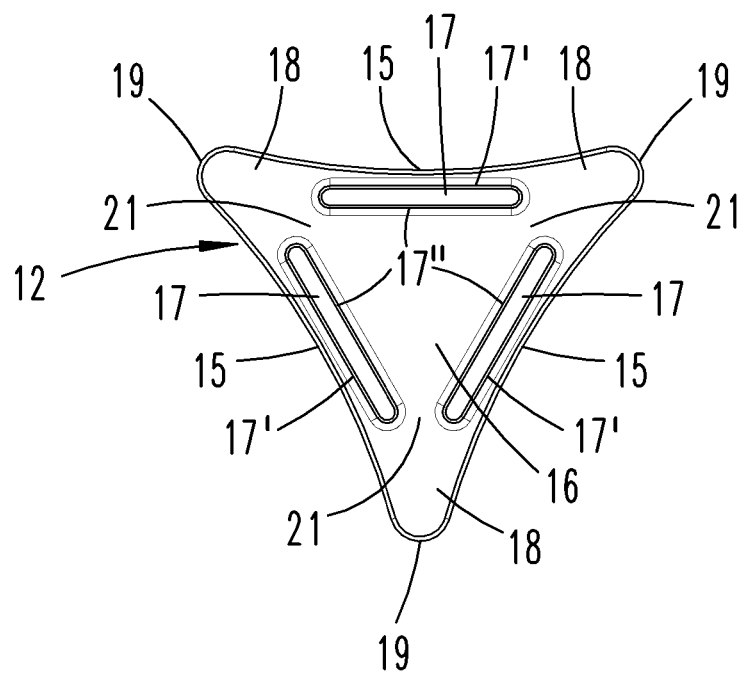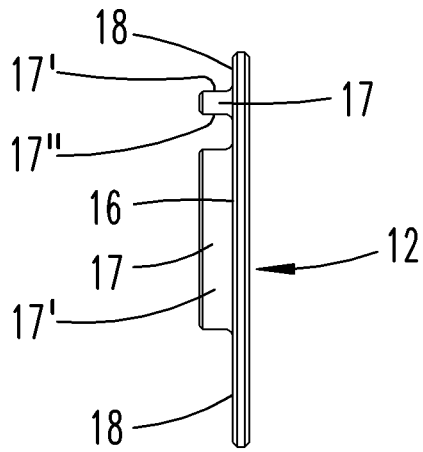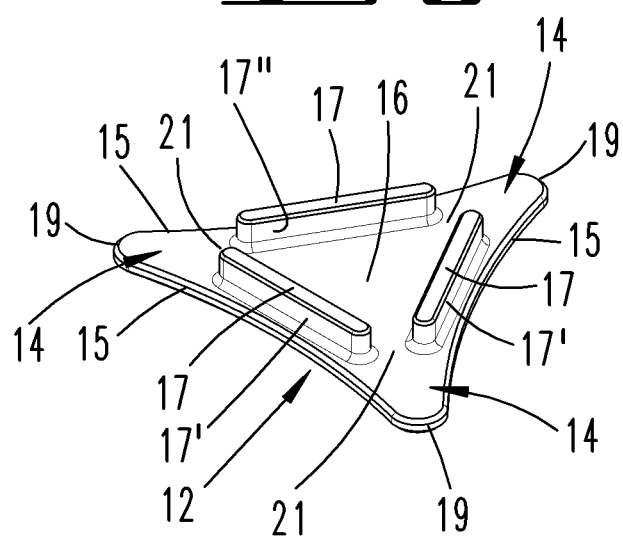

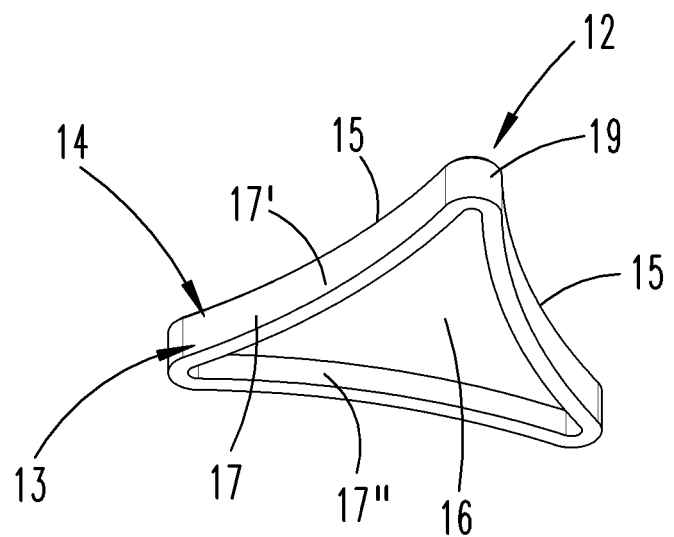
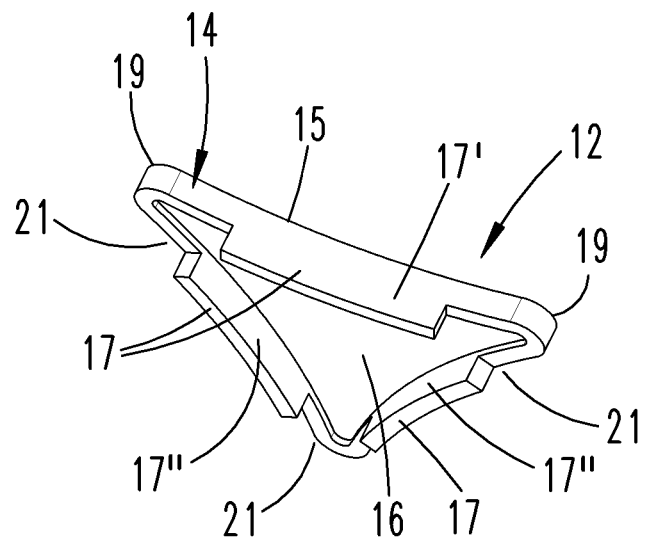

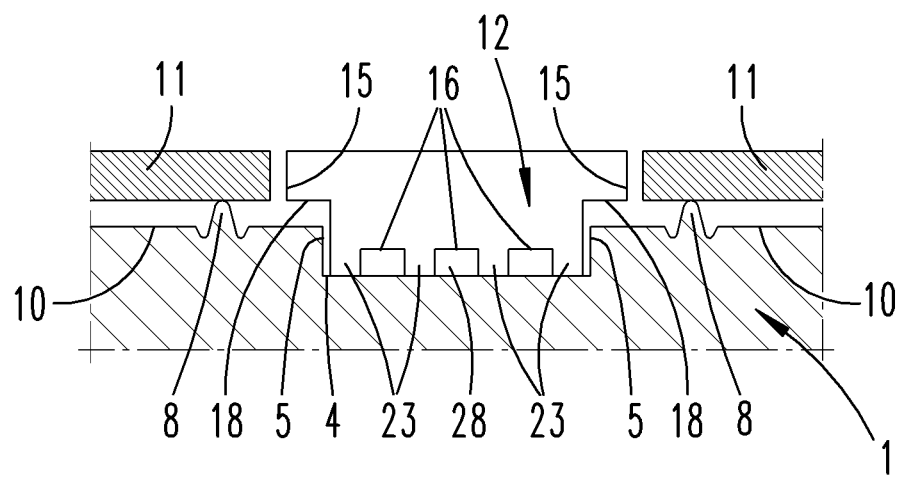
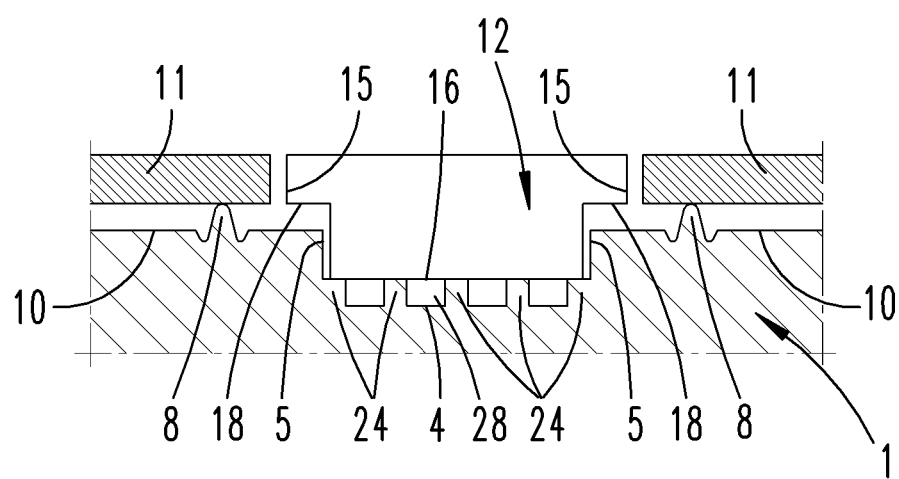

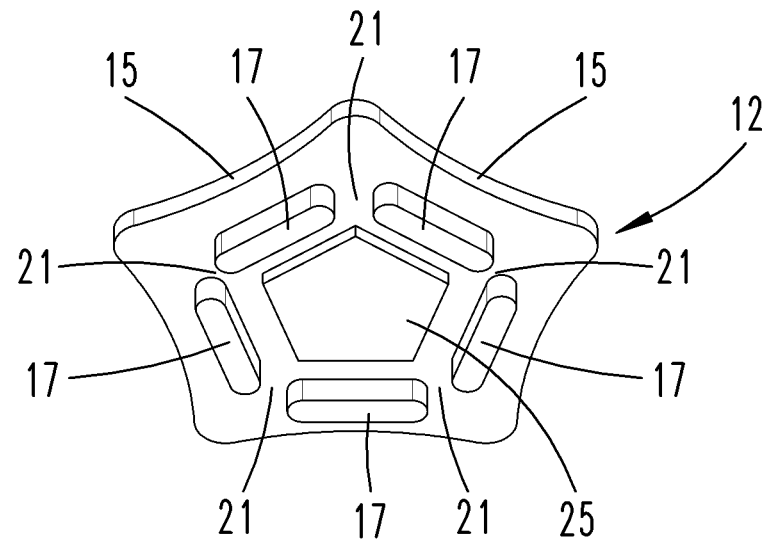
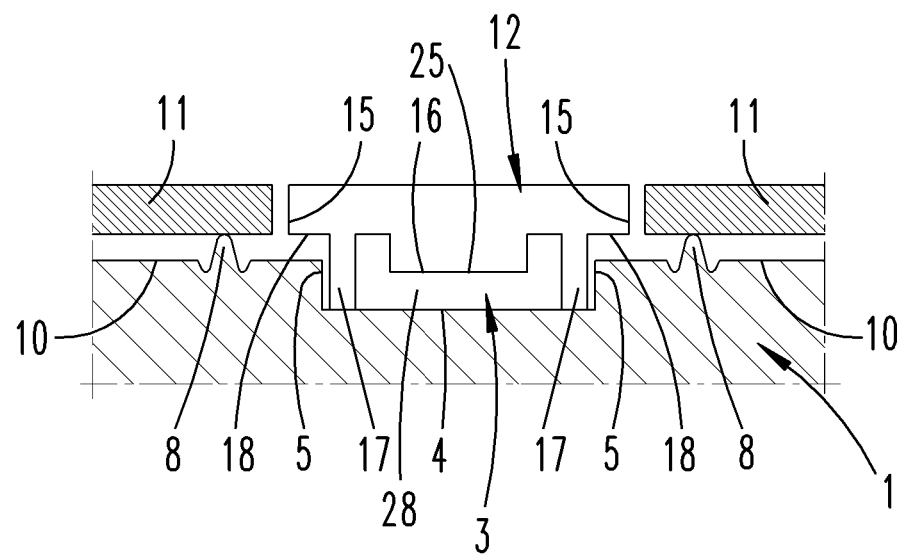

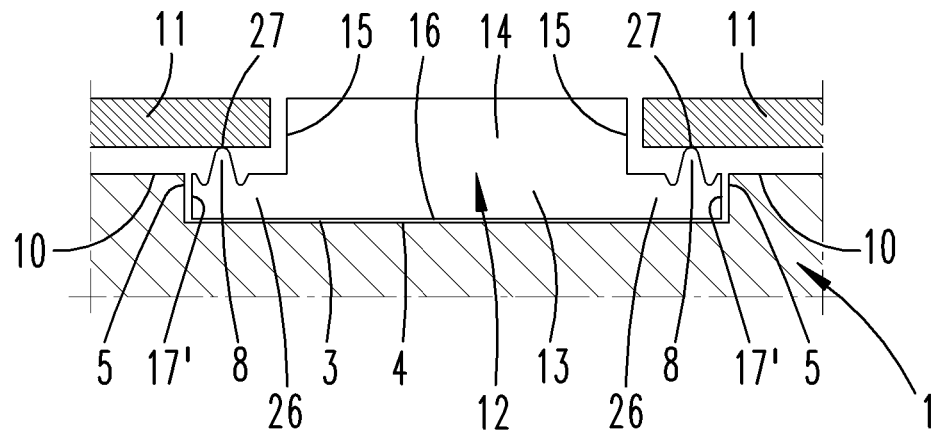
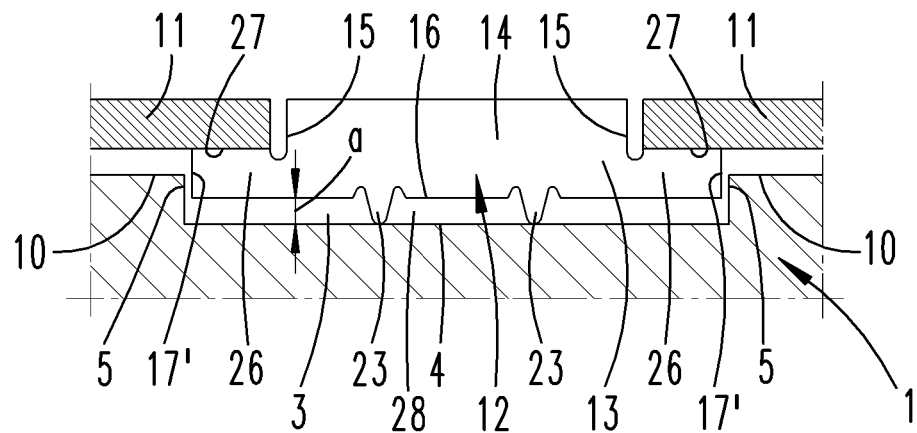
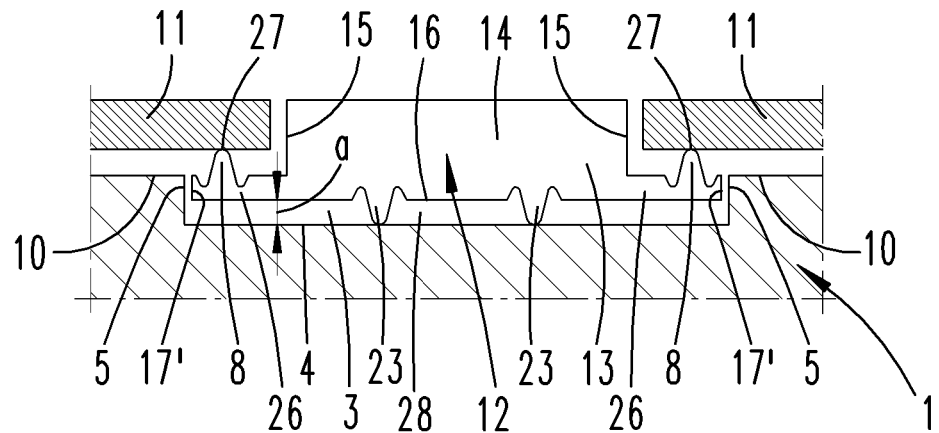

SUSCEPTOR FOR A CHEMICAL VAPOUR
DEPOSITION REACTOR

RELATED APPLICATIONS

This application is a National Stage under 35 USC 371 of and claims priority to International Application No. PCT/EP2017/071152, filed 22 Aug. 2017, which claims the priority benefit of DE Application No. 10 2016 115 614.0, filed 23 Aug. 2016.

FIELD OF THE INVENTION

The invention pertains to a susceptor for a CVD reactor with insertion openings, which are arranged in a bearing surface and into which an insertion section of a positioning element is respectively inserted, wherein said positioning element forms positioning flanks with a section that protrudes from the insertion opening in order to fix the position of a substrate, wherein the insertion openings have sidewalls and a base, and wherein the insertion section comprises contact zones, which abut on the sidewalls, and an underside that faces the base.

BACKGROUND

A generic susceptor is disclosed in DE 10 2007 023 970 A1. The susceptor described in this publication has the shape of a circular disk and comprises a plurality of storage spaces for circular disk-shaped substrates, which are arranged in hexagonally tightest packing on a bearing surface formed by the broadside of the susceptor. Six positioning elements, which are spaced apart from one another and have an approximately triangular outline, are provided on the periphery of a storage space. The triangle sides are curved and form contact flanks, which follow the contour line of the edges of the substrates, in order to thereby hold the substrates in position. In this publication, the positioning elements are described, among other things, as pedestals inserted into insertion openings.

DE 100 43 600 A1 describes a susceptor with a plurality of bearing pockets, which are arranged on a circular arc-shaped line about the center and respectively serve for accommodating a substrate carrier that can be rotationally driven about an axis of rotation. The intermediate space between the substrate carriers is lined with plates, the edges of which follow the perimeter contour of the substrate carriers.

DE 103 23 085 A1 likewise describes a susceptor with multiple substrate carriers, which are arranged on a circular arc-shaped line about the center of the susceptor and surrounded by a ring. The substrate carrier and the ring lie in recesses of a plate arrangement, wherein the plates have an underside that is spaced apart from an upper side of the susceptor by means of spacer elements.

DE 10 2015 113 956 A1 discloses a substrate carrier with a substrate carrier plate, wherein substrates lie on the substrate carrier plate and projections are arranged between said substrates. The projections are inserted into blind bores.

CN 103258763 A and CN 103898478 A describe a susceptor with positioning elements, which are inserted into insertion openings and comprise edge-protruding sections that lie on sections of the bearing surface bordering on the edge of the insertion opening in a contacting manner.

A generic susceptor fulfills its intended function in the process chamber of a CVD reactor, in which it is heated from below and forms the base of the process chamber with its upper side, which serves as a bearing surface for substrates. The ceiling of the process chamber may be formed by a gas inlet element, e.g. in the form of a showerhead, which comprises a gas discharge surface with a plurality of gas discharge openings. The gas discharge surface is cooled such that a high temperature gradient is formed between the heater and the cooled gas discharge surface. The substrates lie in pockets that are defined by the positioning elements, namely on projections originating from the pocket bases, such that the substrates are suspended. The thermal transfer between the susceptor and the substrate therefore takes place through a gas gap between the base of the pocket for receiving the substrates and the underside of the substrates. In contrast, the thermal transfer between the susceptor consisting of graphite and the upper sides of the positioning elements facing the process chamber takes place in the form of thermal conduction such that a lateral temperature difference is formed between the upper side of the substrate and the upper side of the positioning element. A susceptor used in a CVD reactor therefore has the disadvantage that a different temperature level is formed on the island surfaces between the substrates than on the substrates themselves.

A process gas is introduced into the process chamber through the gas inlet element, wherein said process gas consists of multiple components that respectively react pyrolytically on the substrate surface and on the surfaces of the positioning elements. The chemical reaction is dependent on the temperature. Due to the temperature difference, the layer growth on the edge of the substrate surface differs from the layer growth in the center of the substrate surface. This can be attributed, among other things, to the fact that the thermal transfer to the substrate not only takes place in the direction extending transverse to the plane of the substrate, but also from the edge of the positioning elements into the substrates. In order to compensate this thermal transfer, a structuring of the storage spaces for the substrates is proposed in DE 10 2012 108 986 A1 or DE 10 2015 118 215, wherein said structuring is realized in that the substrate storage spaces comprise trench-like depressions in the region of the contact flanks of the positioning elements. However this compensation is not sufficient for many process steps.

SUMMARY OF THE INVENTION

The invention is based on the objective of taking measures for homogenizing the lateral temperature profile over the susceptor fitted with substrates.

This objective is attained with the invention specified in the claims, wherein the dependent claims not only represent advantageous enhancements of both coordinate claims, but also independent solutions.

The inventive enhancement of the susceptor concerns the positioning elements inserted into the insertion openings. According to a first aspect of the invention, the underside of the positioning element is spaced apart from the base of the insertion opening. A hollow space, which is filled with a less thermally conductive substance, is formed as a result of this clearance. The substance may be gas. In this case, a hollow space with a height corresponding to the vertical clearance is located between the underside and the base. However, the clearance may also be filled with a solid or liquid substance that has a lower coefficient of thermal conduction than the material, of which the positioning element is made. To this end, the positioning element may rest, e.g., on a thermal insulating body that is supported on the base of the insertion opening.

According to a second aspect of the invention, it is proposed that the positioning flanks are formed along an edge-protruding section of the positioning section of the positioning element, which protrudes from the insertion opening. This edge-protruding section has an underside that protrudes over a section of the bearing surface, which lies adjacent to the edge of the insertion opening, with a vertical clearance. In this case, the clearance likewise forms a thermal insulating space. The clearance preferably is also filled with a substance in this case, e.g. with a gas or an insulating body that has a lower coefficient of thermal conduction than the material of the positioning element, which preferably is quartz or graphite. It is particularly proposed that the edge-protruding section extends freely over the section of the bearing surface bordering on the edge of the insertion opening such that the process gas is located in the hollow space formed by the clearance.

In a preferred embodiment of the invention, it is proposed that the underside of the positioning element is at least sectionally spaced apart from the base of the insertion opening and that an edge-protruding section is provided, which overlaps the edge surrounding the insertion opening with a clearance. The outline of the positioning element, which is surrounded by the positioning flanks, preferably has a greater surface area than the outline of the insertion section of the positioning element, which is surrounded by the contact flanks, such that the edge of the insertion opening is completely overlapped by the edge-protruding section. The outline of the insertion opening preferably is polygonal. This polygonal opening may be a triangular, tetragonal or pentagonal opening. The corners of the polygonal outline are preferably rounded. The sidewalls of the insertion opening may have a rectilinear extent or a curvilinear extent in the bearing surface. In a preferred embodiment of the invention, the hollow space between the underside of the positioning element and the base surface of the insertion opening extends between the inner walls of webs. The webs preferably protrude from a section of the positioning element, which is realized in the form of a flat body and forms the positioning flanks. The webs may be supported on a base surface that forms the base of the insertion opening. The outwardly directed walls of the webs may form the contact zones in the form of contact flanks. Gaps are arranged between the webs in order to enhance the gas exchange between the hollow space and the process chamber. The webs preferably extend on the edges of a polygon in a rectilinear manner, wherein the gaps are arranged in the region of the corners of the polygons. The undersides of the edge-protruding sections, which face the bearing surface, preferably extend on the same level as the underside of the positioning element. The underside of the edge-protruding section preferably extends in a planar manner, wherein the plane lies parallel to the bearing surface. The underside of the positioning element, which extends within the outline of the base surface, preferably also extends along a plane that lies parallel to the bearing surface or to the base surface. The sidewalls of the insertion openings extend transverse to the bearing surface. The bearing surface and/or the base surface form horizontal surfaces whereas the sidewalls form vertical surfaces. The contact flanks essentially abut on these vertical surfaces flatly such that the contact zones are preferably formed by vertical surfaces.

In a variation of the invention, it is proposed that the underside of the positioning element is supported on a step or a rib formed by the susceptor. The step or rib may be arranged in the edge region of the base of the insertion opening. The step or rib may be spaced apart from the sidewall and originate from the base surface. However, the step or rib may also lie directly adjacent to the sidewall. According to the invention, it is therefore preferred that the step or rib is located in a region of the base of the insertion opening, which is spaced apart from the sidewalls. However, the step may also extend directly along the sidewalls. It is furthermore proposed that projections, which are spaced apart from the contact flanks, protrude from the underside of the positioning element. The positioning element can be supported on the base of the insertion opening with these projections. The underside of the positioning element may furthermore have a curvature. The curvature may be directed toward the base or away from the base. The curvature may have an apex, by means of which the positioning element is supported on the base. However, the curvature may also form a hollow space. The base may furthermore not extend in a planar manner, but rather be curved. An apex of the curved base may in this case also form a contact zone, on which the underside of the positioning element is supported. The apex may be punctiform or extend linear. However, the base may also be curved away from the positioning element and thereby form the hollow space or locally enlarge the size of the hollow space between the underside and the base. The positioning elements may be made of graphite and coated with a surface of SiC. The positioning elements may also be made of solid SiC material. However, the positioning elements may also consist of graphite (isostatically pressed fine-grain graphite). The coating may not only consist of SiC, but also of AlN. The SiC may be sintered or produced by means of CVD. Furthermore, $Si_3N_4$, quartz (silica glass; $SiO_2$) or $Al_2O_3$ may likewise be considered as coating, the latter also in the form of crystalline sapphire or $Al_2O_3$ ceramic. In addition, $ZrO_2$ (circonia) or $Y_2O_3$ (circonia), as well as Mo, W, WC or CrTiAlN, may also be used for the coating. It is furthermore proposed that the positioning elements consist of coated SiC, wherein the coating may consist of one of the above-described materials, particularly SiC. It is advantageous to coat a SiC positioning element with a separate SiC layer because the coating is produced differently than the solid material. The coating may be applied in a CVD process and therefore has a greater purity and prevents contamination of the deposited layers in the MOCVD reactor. A temperature barrier is formed as a result of the clearance between at least a section of the underside of the positioning element and the base of the insertion opening and/or the edge-protruding section and the bearing surface of the susceptor, wherein said temperature barrier causes the temperature of the surface of the susceptor, which is heated from below, to be higher than the temperature on the surface of the positioning element and, in particular, in the region of the positioning flank of the positioning section. The positioning element may be made of a solid material. However, it may also consist of multiple sections that are connected to one another and made of a different material. The hollow space being formed is preferably provided with an opening, which may be formed, e.g., the above-described gaps, such that a gas exchange can take place between the hollow space and the process chamber. The edges of the insertion opening may be rounded such that the sidewalls of the insertion opening transform into the bearing surface in a rounded manner. These rounded sections of the edges preferably are overlapped by the edge-protruding section. The substrate may lie on bearing projections, e.g. in the form of a rib, such that a hollow space is formed between the base of the storage space and the underside of the substrate. The bearing projection may be flanked by trenches in the radial direction—referred to the substrate. It is particularly proposed that a surface of the substrate lying on the susceptor, which faces the process chamber, transforms into the upper side of the positioning element facing the process chamber in a flush manner. However, a step may also be formed between the planar upper side of the positioning element and the upper side of the substrate.

According to another aspect of the invention, the largest surface section of the positioning element lies in the insertion opening. As a result of this design, the insertion section of the positioning element, which protrudes into the insertion opening, forms an edge undergrip section in the form of a bearing zone, on which an edge section of the substrate lies. The bearing zone may furthermore comprise the above-described bearing projections, on which the edge of the substrate lies in punctiform or linear contact. The above-described means also make it possible to form a clearance, which during the operation of the device is filled with a medium or contains a medium with a different thermal conductivity than the positioning element or the susceptor, between the underside of the insertion section and the base surface of the insertion opening. The medium may be a gas with lower thermal conductivity or a solid body with lower thermal conductivity.

In a variation of the invention, it is proposed that the hollow space between the underside of the positioning element and the base surface of the insertion opening extends between a sidewall and a projection, wherein the projection is formed by a step or a pedestal that originates from the base of the insertion opening. The projection has a carrying surface that extends parallel to the plane of the base and forms a carrying section, on which the positioning element is supported with a supporting section. The positioning element is preferably realized in the form of a flat body with a planar underside and a planar upper side extending parallel thereto. It is preferred that the positioning element consists of SiC, particularly grown SiC. The carrying surface of the projection, on which a planar support section of the underside of the positioning element is supported, preferably is spaced apart from the base surface by about 200 µm. It is preferred that the clearance between the base surface of the base and the underside of the positioning element, i.e. the height of the hollow space, lies in the range between 100 µm and 500 µm. The clearance preferably lies in the range between 100 µm and 300 µm. The height of the positioning element, which in the case of a flat positioning element corresponds to its material thickness, preferably is chosen in such a way that a section of the positioning element protrudes from the insertion opening such that edges of substrates can be supported on the positioning flanks of the positioning element. In a preferred embodiment of the invention, the projections border directly on the sidewalls of the insertion opening. The projections may be shorter than the length of the sidewalls such that regions, which are free of projections, may exist between the ends and the rounded corners of the insertion openings. In an alternative embodiment, it is proposed that the projections are provided in the region of the rounded corners of the insertion opening. A groove may be arranged between the wall of the insertion opening and the projection. The wall between the projections may also be realized free of projections in this variation.

The invention therefore pertains to a susceptor, in which a positioning element inserted into an insertion opening has a first underside section with a supporting section that is supported on a carrying section of the base of the insertion opening. The carrying section is assigned to a first section of the base. The underside of the positioning element and the base of the insertion opening respectively form a second section. The two second sections are spaced apart from one another by a clearance other than zero such that a hollow space is formed between the base and the underside.

Consequently, the invention furthermore pertains to a susceptor, in which a positioning element inserted into an insertion opening has an edge-protruding section that protrudes over the bearing surface with a clearance other than zero such that a free space is formed between the edge-protruding section and the bearing surface.

BRIEF DESCRIPTION OF THE DRAWINGS

The invention is described in greater detail below with reference to exemplary embodiments. In the drawings:

FIG. 3 shows a longitudinal section along the line in FIG. 2, FIG. 4 shows a longitudinal section through a positioning element inserted into an insertion opening 3 approximately along the line of section IV-IV in FIG. 1, FIG. 5 shows a top view of a positioning element, FIG. 6 shows a bottom view of a positioning element, FIG. 7 shows a side view of a positioning element, FIG. 8 shows a perspective bottom view of the positioning element, FIG. 9 shows a second exemplary embodiment of a positioning element in the form of a perspective representation, FIG. 10 shows a third exemplary embodiment of a positioning element in the form of a perspective representation, FIG. 22 shows a fifteenth exemplary embodiment of a positioning element in the form of a sectioned representation, FIG. 23 shows a sixteenth exemplary embodiment of a positioning element in the form of a sectioned representation, FIG. 24 shows a seventeenth exemplary embodiment of a positioning element in the form of a perspective representation, FIG. 25 shows the seventeenth exemplary embodiment in the form of a sectional representation, FIG. 28 shows a twentieth exemplary embodiment of the invention in the form of a representation according to FIG. 4, FIG. 29 shows a twenty-first exemplary embodiment in the form of a representation according to FIG. 4, FIG. 30 shows a twenty-second exemplary embodiment in the form of a representation according to FIG. 4.

DETAILED DESCRIPTION

An inventive susceptor is used in a CVD reactor of the type diversely described in the relevant literature. In this context, we refer to DE 10 2013 114 412 A1 or DE 10 2011 056 589 A1 as mere examples. The technological problems of the temperature management in a CVD reactor are described, for example, in DE 10 2014 100 024 A1.

Figure 1:
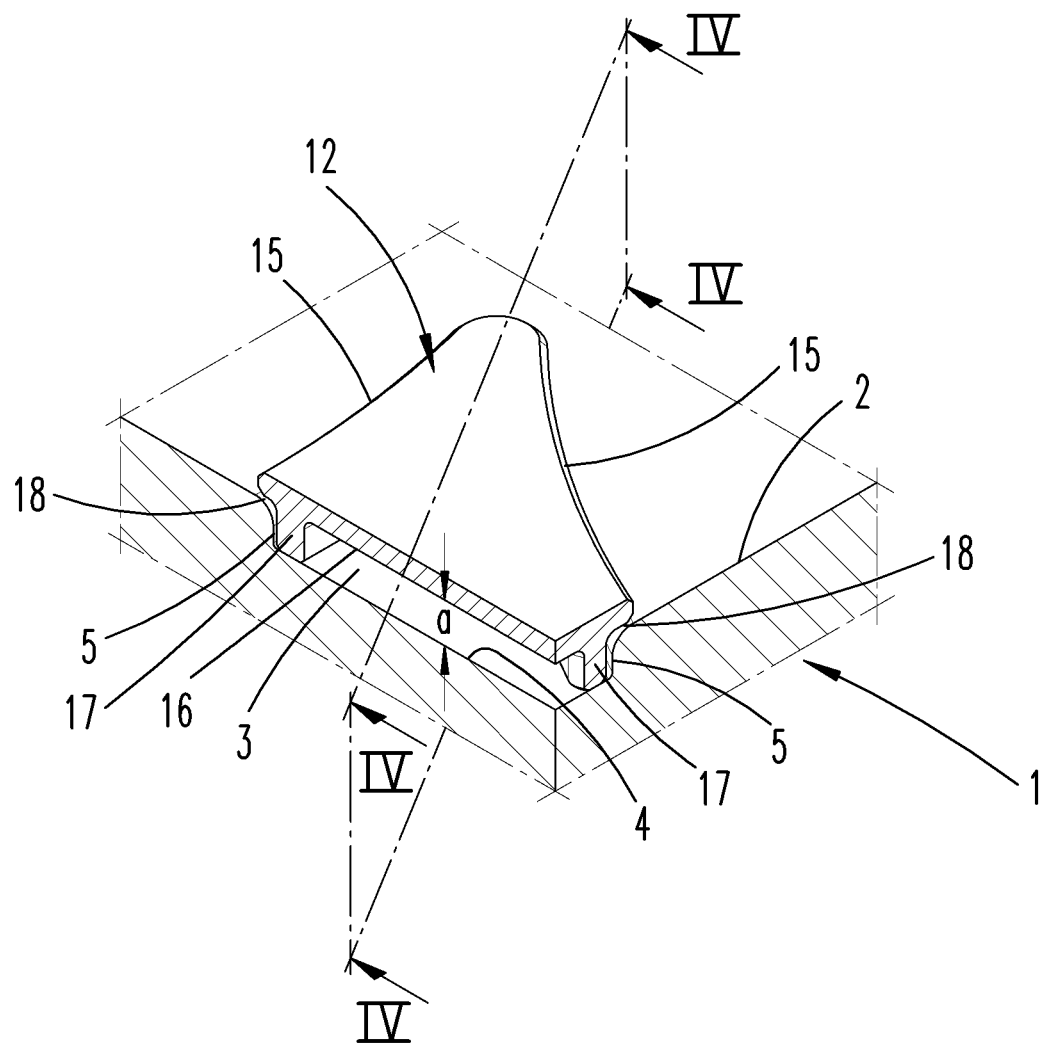
FIG. 1 shows a positioning element 12 that is inserted into an insertion opening 3 of a susceptor 1 and supported on the planar base 4 of the insertion opening 3 with webs 17 in the form of partially sectioned perspective view.
Figure 2:
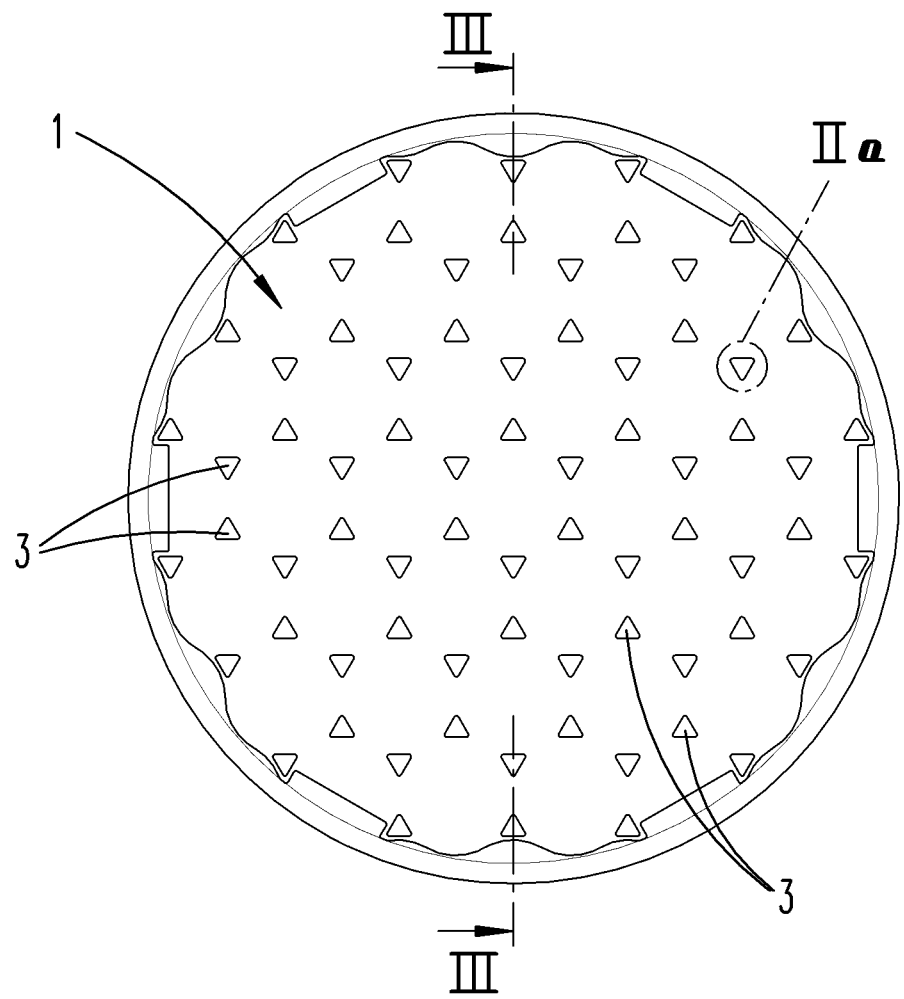
FIG. 2 shows a susceptor with a plurality of insertion openings 3, which respectively serve for inserting a positioning element 12 such that a storage space for a substrate is respectively formed between six positioning elements 12, in the form of a top view.
Figure 2A:
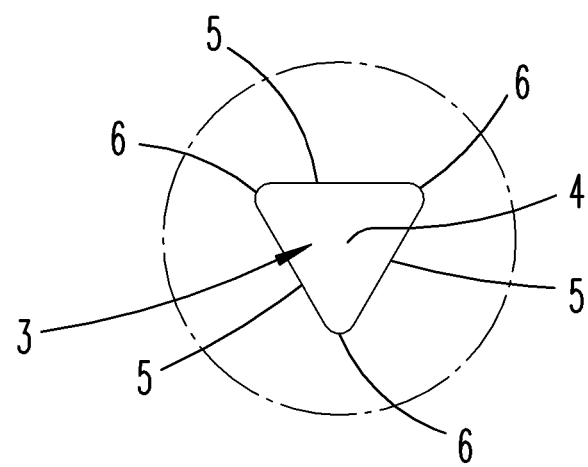
FIG. 2a shows one of the insertion openings 3 according to the detail IIa in FIG. 2 in the form of an enlarged view.

FIG. 2 shows a top view of a susceptor with a plurality of a hexagonally arranged insertion openings 3, into each of which a positioning element 12 can be inserted such that an essentially circular storage space for a circular substrate is respectively formed between six positioning elements 12. FIG. 3 shows a cross section through the susceptor along the line III-III in FIG. 2. It can be gathered that rear hollow spaces 7 are also provided and located in the center of each storage space for a substrate 11.

FIGS. 4-8 show a first exemplary embodiment of a positioning element 12 that can be inserted into one of the insertion openings 3. The positioning element 12 has an insertion section 13, by means of which the positioning element 12 can be fastened on the susceptor 1. To this end, the insertion section 13 is inserted into the insertion opening 3. The insertion opening 3 has a base surface 4 that extends parallel to a bearing surface 2 and is realized in a planar manner. The insertion opening 3 furthermore has sidewalls 5 that essentially extend perpendicular to the bearing surface. The positioning element according to the first exemplary embodiment is inserted into an insertion opening 3 that has an essentially triangular outline, in which the sidewalls 5 are formed by planes.

The insertion section 13 has three outwardly directed contact flanks 17' that abut on the sidewalls 5 in a contacting manner during the insertion of the positioning element 12. In the first exemplary embodiment, the contact flanks 17' are formed by webs 17 that extend along the side of an equilateral triangle. Gaps 21 are provided in the corner regions of this imaginary equilateral triangle such that the webs 17 are not connected to one another in the circumferential direction. The webs have inner walls 17", which are directed toward one another, such that a hollow space is formed between the three inner walls 17", wherein the hollow space is connected to the surroundings by the gaps 21. Flow-through zones, through which gas can flow from the hollow space between the underside 16 and the base surface 4 into the process chamber, are thereby formed in the corner regions of the triangle.

The positioning element 12 furthermore has a positioning section 14. In the inserted state of the insertion section 13 in the insertion opening 3, the positioning section 14 protrudes over the bearing surface 2 of the susceptor 1. The positioning section 14 is essentially formed by a flat body that has a flat upper side and a flat underside 16. The webs 17 are supported on the base surface 4 of the insertion opening 3—as shown in FIG. 4—when the insertion section 13 is inserted into the insertion opening 3. The contact flanks 17' respectively abut on a sidewall 5 in a contacting manner. A clearance a is formed between the underside 16 facing the base 4 and the base 4, wherein said clearance is in the exemplary embodiment illustrated in FIGS. 4-8 greater than the depth of the insertion opening 3 such that an edge-protruding section 18, which lies flushly adjacent to the underside 16, extends over the bearing surface 2 with a clearance b.

The free space between the edge-protruding section 18 and an edge section 6' of the insertion opening 3, which is formed by the clearance b, thereby forms a ventilation channel for ventilating the hollow space between the underside 16, the base 4 and the inner walls 17" through the gaps 21.

The rectilinear lateral edges of the sidewalls 5 and the rounded corners 6 respectively transform into the bearing surface 2 in the form of a rounding 9. The edge section 6' lies adjacent to the rounding section 6 and is overlapped by the edge-protruding section. The rounding section 6 lying adjacent to the sidewall 5 is likewise overlapped by an edge-protruding section 18. In this case, the edge of the edge-protruding section 18 forms a positioning flank 15 that extends on an arc-shaped line along the edge of the substrate 11.

The substrate is supported on a bearing projection 8 that is flanked by a trench on both sides. The base 10 of the storage space for the substrate 11 is spaced apart from the underside of the substrate 11 such that the substrate 11 is suspended above the base 10.

The positioning element 12 has a ternary symmetry and consists of graphite coated with SiC or of graphite. However, it may also consist of quartz or another suitable inorganic material. The height of the webs 17 is greater than the height of the positioning flanks 15.

The positioning element 12 may comprise a base body that is provided with a coating. The base body may consist of the following materials: graphite (isostatically pressed fine-grain graphite), SiC (produced by means of CVD or sintered), AlN; $Si_3N_4$, BN, quartz (e.g. pure silica glass, $SiO_2$); $Al_2O_3$ in the form of crystalline sapphire or fine-grain ceramic, $ZrO_2$ (circonia) or titanium oxide (yttria, particularly ceramic), combinations of all aforementioned materials, fire-resistant metals such as Mo, W or carbides, e.g. WC, SiC, wherein the carbides may be produced by means of CVD, or of the following materials: AlN (aluminum nitrite); c-BN (cubic boron nitride); TiN (titanium nitride) or a combination with AlN; (TiAlN); TiC (titanium carbide) or a combination with TiN; (TiCN) TaC (tantalum carbide); WC (tungsten carbide); $Si_3N_4$ (silicon nitride); BN (boron nitride); $Al_2O_3$ (alumina), $ZrO_2$ (circonia) or $Y_2O_3$ (yttria) in the form of ceramic material or in combination with other ceramic materials such as those used in thermal barriers.

The second exemplary embodiment of a positioning element 12, which is illustrated in FIG. 9, likewise comprises an insertion section 13 that can be inserted into the insertion opening 3 and a positioning section 14 that protrudes from the insertion opening 3. This positioning section forms the positioning flanks 15 that, however, flushly transform into the contact flanks 17' of a web 17. In this case, the underside 16 and the inner walls 17" of the web 17 also define a hollow space above the base 4 of the insertion opening. However, the web 17 completely surrounds the hollow space in this exemplary embodiment such that no gaps 21 exist.

The third exemplary embodiment illustrated in FIG. 10 essentially corresponds to the second exemplary embodiment illustrated in FIG. 9, but gaps 21 are formed between individual ribs 17 in this case for ventilation purposes.

Figure 11:
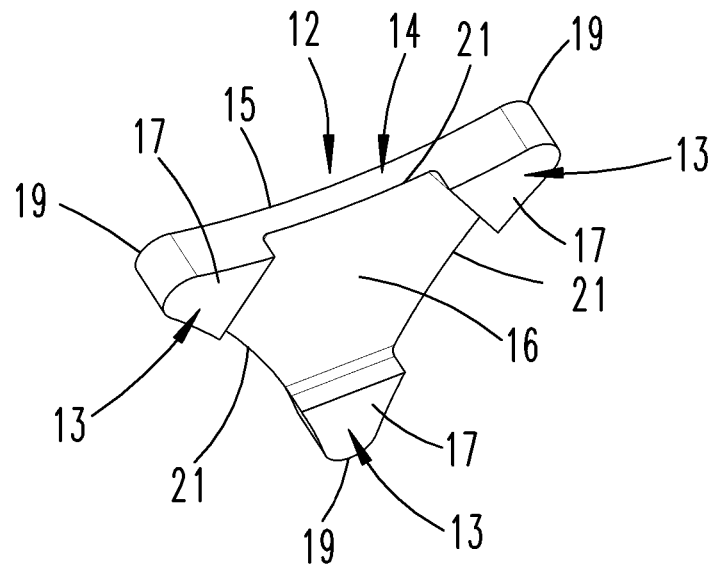
FIG. 11 shows a fourth exemplary embodiment of a positioning element in the form of a perspective representation.

In the fourth exemplary embodiment illustrated in FIG. 11, the corner regions of the positioning element 12 are provided with ribs 17, by means of which the positioning element 12 can be supported on the base 4 of the insertion opening 3. As in the second or third exemplary embodiment, the perimeter contour of the positioning flanks 15 corresponds to the perimeter contour of the contact flanks 17'. The underside 16 is set back relative to the bearing surfaces of the webs 17 such that a hollow space is formed between the underside 16 and the base surface 4. A gap 21 is formed between the edge of the underside 16 and the rounded outer edge of the sidewall 5 when the positioning element 12 is inserted into an insertion opening 3. In this exemplary embodiment, the contact flanks are realized in the form of rounded surfaces. The underside of the edge-protruding sections 18 of the positioning element 12 inserted into an insertion opening 3 protrudes over the bearing surface 2 with a vertical clearance.

Figure 12:
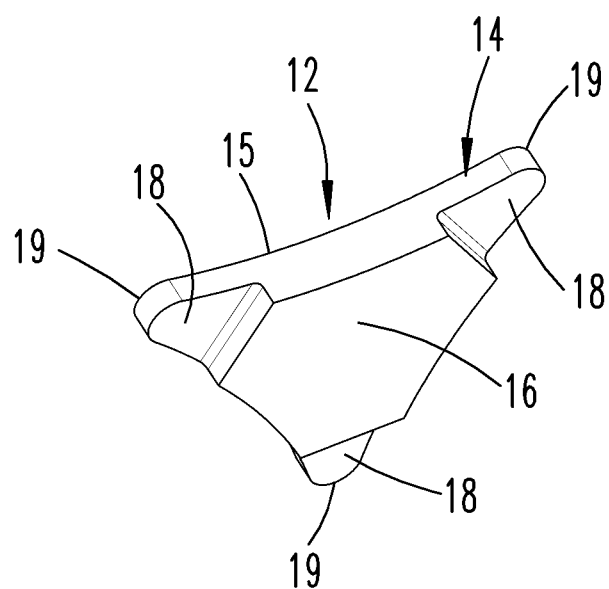
FIG. 12 shows a fifth exemplary embodiment of a positioning element in the form of a perspective representation.

In the fifth exemplary embodiment illustrated in FIG. 12, the underside 16 may lie on the base 4. However, the underside 16 may also be supported on steps 22 that originate from the base 4 of the insertion opening. Edge-protruding sections 18 are provided in the region of the corner sections of the positioning element 12 and protrude over edge sections formed by the bearing surface of the susceptor 1.

FIGS. 13-23 schematically show other exemplary embodiments, in which positioning flanks may extend as shown in the above-described figures. These exemplary embodiments also comprise contact flanks, by means of which the positioning element 12 is laterally fixed in position in the insertion opening 3.

Figure 13:
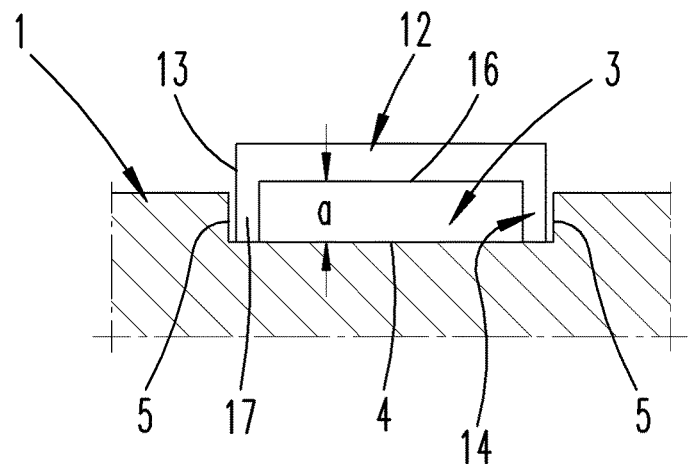
FIG. 13 shows a sixth exemplary embodiment of a positioning element in the form of a sectioned representation.

FIG. 13 shows a sixth exemplary embodiment in the form of a sectional representation, in which webs 17 of the edge of the positioning element 12 are supported on the planar base 4 of the insertion opening 3. In this case, the perimeter contour of the insertion opening 3 also corresponds to the perimeter contour of the edge of the positioning section 14 protruding from the insertion opening 3, wherein the positioning section may in this exemplary embodiment also comprise the edge-protruding sections 18 illustrated in the FIG. 12.

Figure 14:
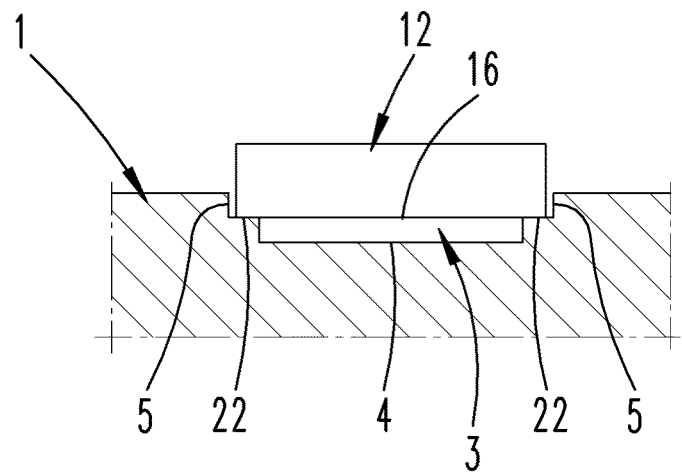
FIG. 14 shows a seventh exemplary embodiment of a positioning element in the form of a sectioned representation.

In the seventh exemplary embodiment illustrated in FIG. 14, the insertion opening 3 forms projections or steps 22 that extend along the sidewalls 5, wherein the underside 16 of the positioning element 12 can be supported on said projections or steps in such a way that the central section of the underside 16 is spaced apart from the base 4. In this exemplary embodiment, the clearance space between the underside 16 and the base 4 also forms a free hollow space for accommodating a gas.

Figure 15:
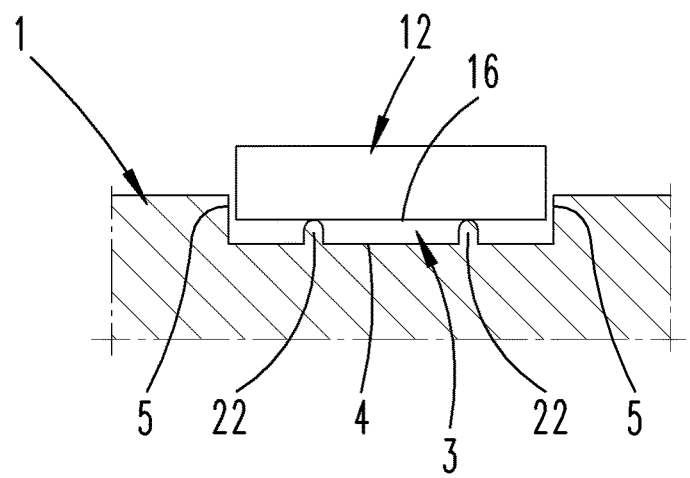
FIG. 15 shows an eighth exemplary embodiment of a positioning element in the form of a sectioned representation.

In the eighth exemplary embodiment illustrated in FIG. 15, the planar underside 16 of the positioning element 12 is likewise supported on a step 22. However, the step 22 is realized in the form of a rib in this case and spaced apart from the sidewall 5. Multiple ribs 22 are provided and spaced apart from one another.

Figure 16:
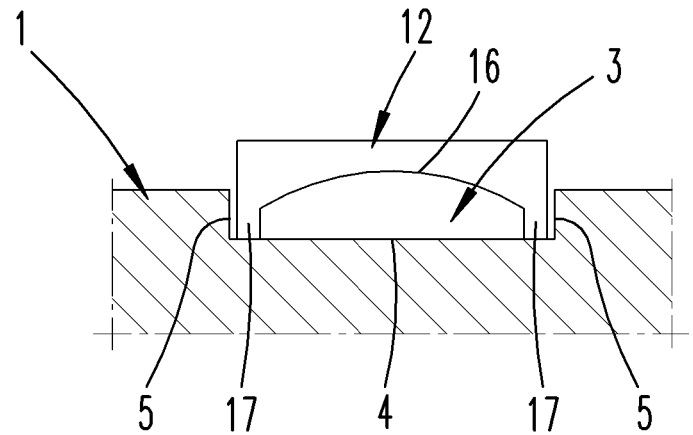
FIG. 16 shows a ninth exemplary embodiment of a positioning element in the form of a sectioned representation.

In the ninth exemplary embodiment illustrated in FIG. 16, a web 17 of the positioning element 12 is supported on the base 4. However, the underside 16 is curved and has the greatest clearance from the base 4 in the apex of the curvature. In a variation, the curvature may also be realized in the opposite direction such that the apex of the curvature is supported on the base 4. However, the apex may also have a smaller clearance from the base 4 than a region of the underside 16 surrounding the apex.

Figure 17:
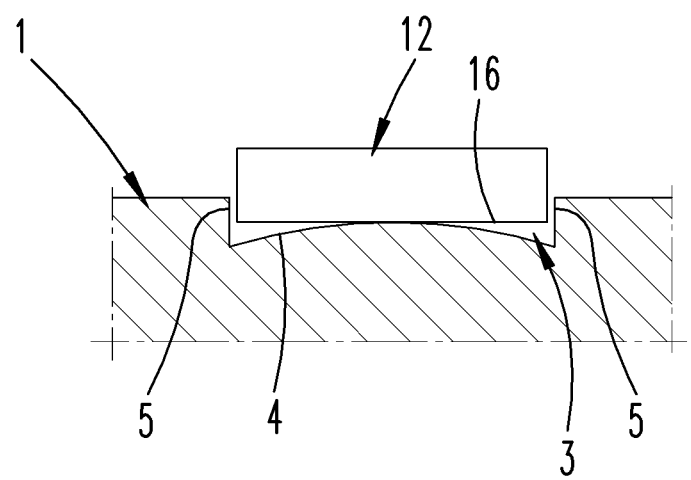
FIG. 17 shows a tenth exemplary embodiment of a positioning element in the form of a sectioned representation.

In the tenth exemplary embodiment illustrated in FIG. 17, the base 4 of the insertion opening 3 is curved. In this case, the curvature extends into the insertion opening 3 such that a central section of the underside 16 can be supported on the apex of the curvature of the base 4. The curvature of the base 4 may in this case also extend out of the insertion opening 3 such that the greatest clearance of the hollow space between the underside 16 and the base 4 lies in the region of the apex of the base. Additional webs or projections may be provided for supporting the positioning element 12 in such a way that the apex of the base is spaced apart from the underside 16.

Figure 18:
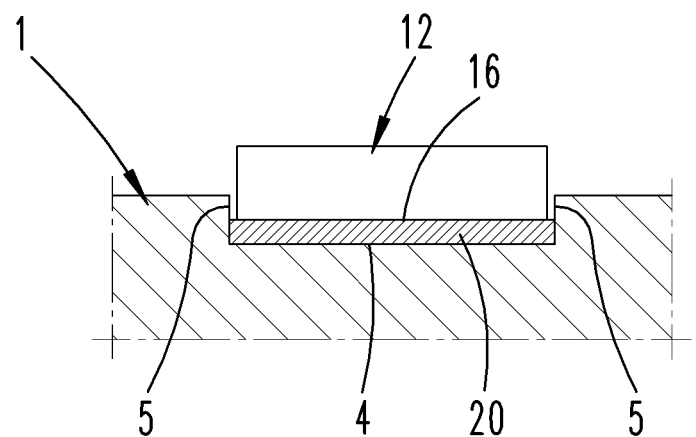
FIG. 18 shows an eleventh exemplary embodiment of a positioning element in the form of a sectioned representation.

In the eleventh exemplary embodiment illustrated in FIG. 18, the clearance space between the underside 16 of the positioning element 12 and the base 4 is filled with a body 20 that has a thermal insulating property. The thermal conductivity of the body 20 differs from the thermal conductivity of the susceptor 1 and of the positioning element 12. The body 20 preferably has a lower thermal conductivity than the susceptor 1 and/or the positioning element 12.

Figure 19:
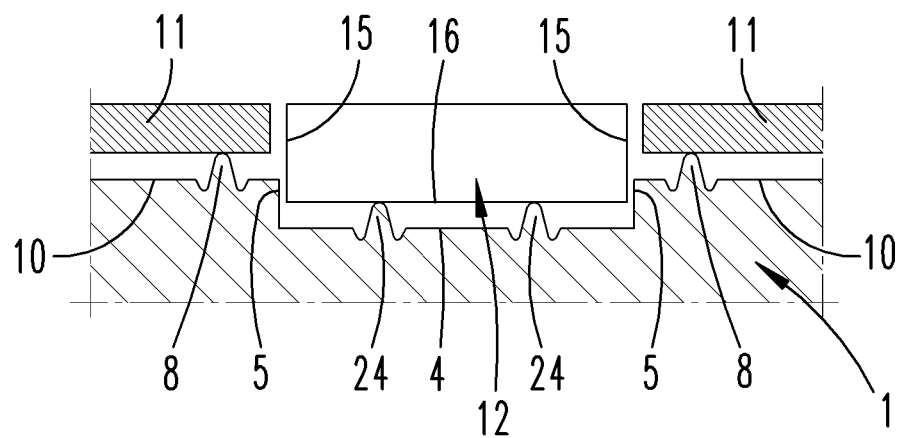
FIG. 19 shows a twelfth exemplary embodiment of a positioning element in the form of a sectioned representation.

The twelfth exemplary embodiment illustrated in FIG. 19 comprises a positioning element 12 that is arranged in the region between two substrates 11, wherein the substrates 11 are supported on bearing projections 8. In this exemplary embodiment, the positioning element 12 is realized in the form of a flat body that sectionally protrudes into the insertion opening 3 and therefore can be supported on the sidewall 5 with contact flanks. The underside 16 of the positioning element 12 is spaced apart from the base 4 by means of projections 24 that originate from the base 4. The positioning element 12 may have a prismatic shape in this case. The projections 24 may be flanked by trenches.

Figure 20:
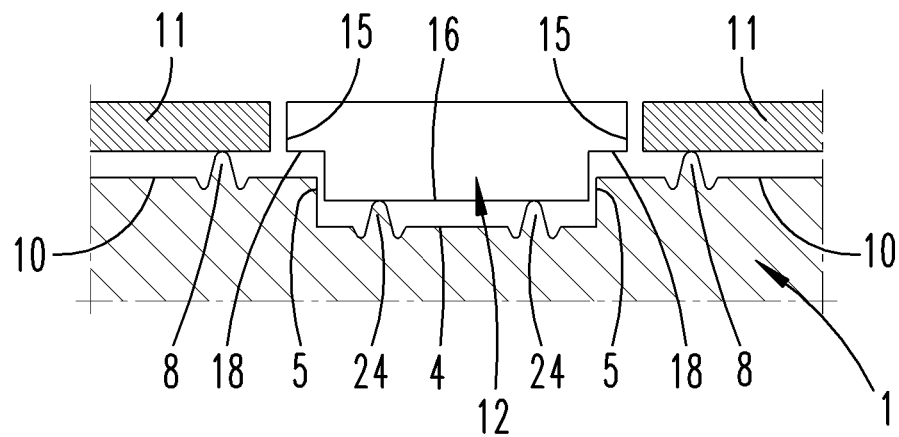
FIG. 20 shows a thirteenth exemplary embodiment of a positioning element in the form of a sectioned representation.

In the thirteenth exemplary embodiment illustrated in FIG. 20, which concerns an enhancement of the twelfth exemplary embodiment illustrated in FIG. 19, the positioning element 12 forms a peripheral step, which in turn forms an edge protrusion 18 that extends above the bearing surface 2 of the susceptor 1 with a clearance.

Figure 21:
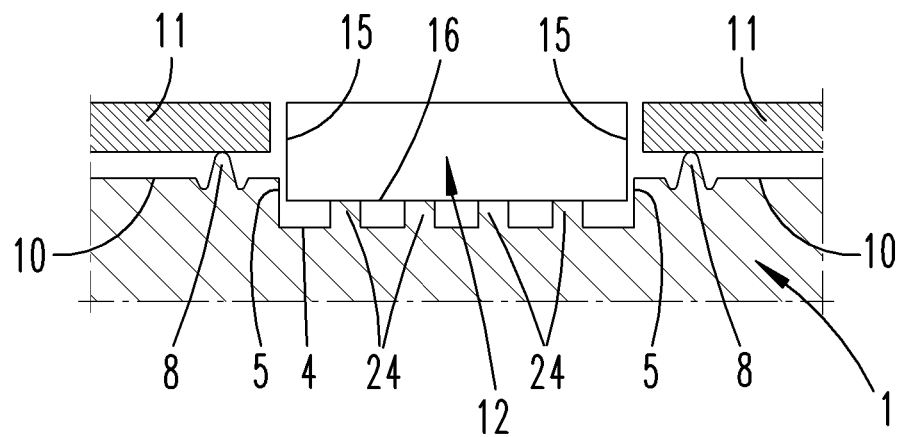
FIG. 21 shows a fourteenth exemplary embodiment of a positioning element in the form of a sectioned representation.

The fourteenth exemplary embodiment illustrated in FIG. 21 comprises a positioning element 12 with multiple projections 24 that protrude from the base 4, wherein the substrate rests on said projections. In contrast to the exemplary embodiments illustrated in FIGS. 19 and 20, in which the projections 24 form rounded bearing zones and the sidewalls of the projections 24 extend obliquely to one another, the projections 24 of the fourteenth exemplary embodiment have planar bearing zones and lateral flanks that extend parallel to one another.

The fifteenth exemplary embodiment illustrated in FIG. 22 comprises a positioning element 12, from the underside 16 of which protrude projections 23 that are supported on the base 4 of the insertion opening 3. The positioning element 12 has an edge-protruding section 18 that extends over the entire lateral outline of the positioning element 12. However, it would also be conceivable to realize alternative embodiments, in which the positioning element 12 does not comprise an edge-protruding section 18 as it is the case, e.g., with the positioning elements 12 according to the twelfth and fourteenth exemplary embodiment.

In the sixteenth exemplary embodiment illustrated in FIG. 23, a base 4 of the insertion opening 3 comprises a plurality of projections 24, on which the planar underside 16 of the positioning element 12 can be supported. The positioning element 12 may comprise no edge-protruding sections 18 as shown in FIG. 21. However, it may also comprise edge-protruding sections 18 analogous to the exemplary embodiment illustrated in FIG. 22. A few of the projections 24 border directly on the sidewall 5.

The projections, which are identified by the reference numerals 23 and 24 in the figures, may be realized in the form of ribs or strips. However, they may also be realized in the form of individual projections that are arranged, e.g., in a tessellated manner. Their cross section may be polygonal or rounded.

FIGS. 24-25 show a seventeenth exemplary embodiment of the invention, in which the webs 17 are arranged on the sidelines of a regular pentagon. Gaps 21 are formed between the individual webs 17. One peculiarity of this exemplary embodiment is a pedestal 25, which protrudes from the underside 16 of the positioning element 12 in the region of the center and thereby slightly reduces the clearance between the underside 16 and the base surface 4 in the region of the center of the insertion opening 3. The sidewalls of the pedestal 25 are spaced apart from the inner walls of the webs 17. The hollow space between the underside 16 and the base surface 4 therefore has a smaller height in its central region than in its edge region bordering on the web. 17. An edge-protruding section 18 protrudes over the edge of the sidewall 5 such that a gap opening, which surrounds the insertion opening 3, is formed between the edge-protruding section 18 and the bearing surface 2.

Figure 26:
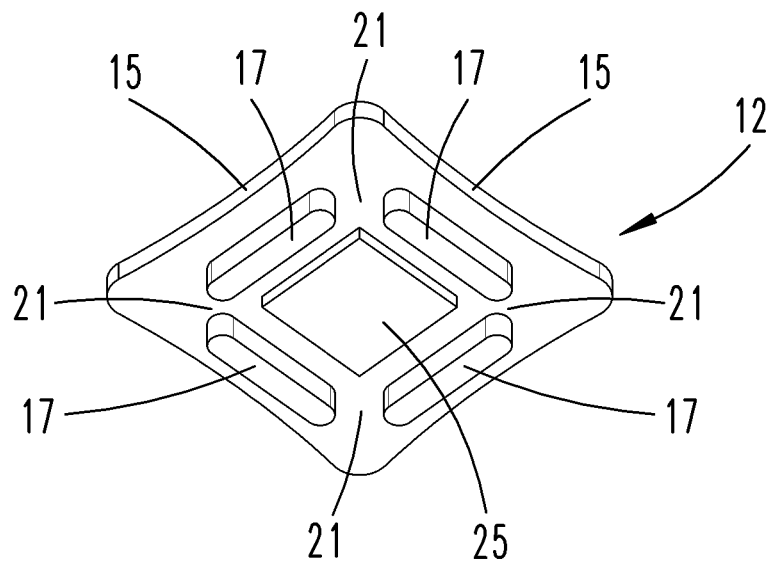
FIG. 26 shows an eighteenth exemplary embodiment of a positioning element in the form of a perspective representation.

FIG. 26 shows an eighteenth exemplary embodiment of the invention, in which the webs 17 are arranged on the sidelines of a square. In this case, gaps 21 are also formed in the corner points such that the four webs 17 are not connected to one another. One peculiarity of these square positioning elements 12 can be seen in that a central pedestal 25 is likewise provided in the region of the underside 16 and reduces the clearance between the underside 16 and the base surface 4 at this location.

FIGS. 27-30 show other exemplary embodiments of the invention, in which the outline surface area of the insertion section 13 inserted into the insertion opening 3 is greater than the outline surface area of the positioning section 14, which protrudes from the insertion opening and comprises the positioning flanks 15. Edge undergrip sections 26, which engage underneath the edge of the substrate 11, are thereby formed.

Figure 27:
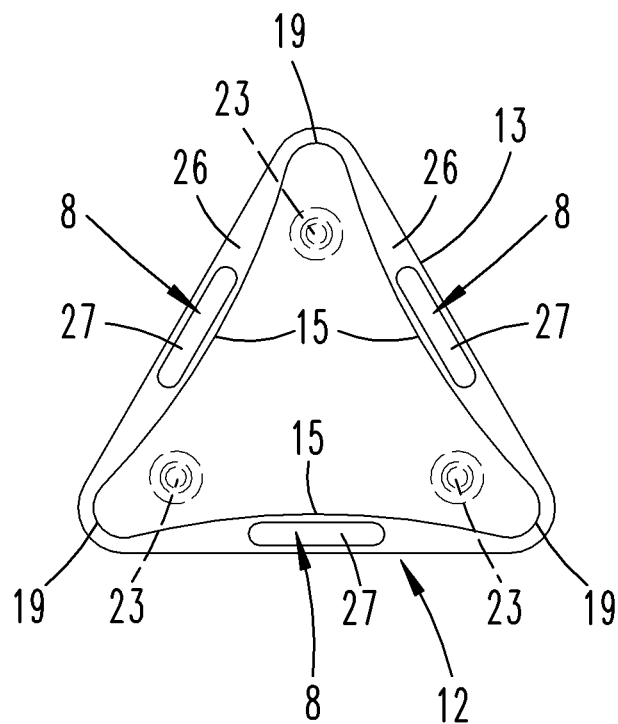
FIG. 27 shows a nineteenth exemplary embodiment of a positioning element in the form of a top view.
Figure 31:
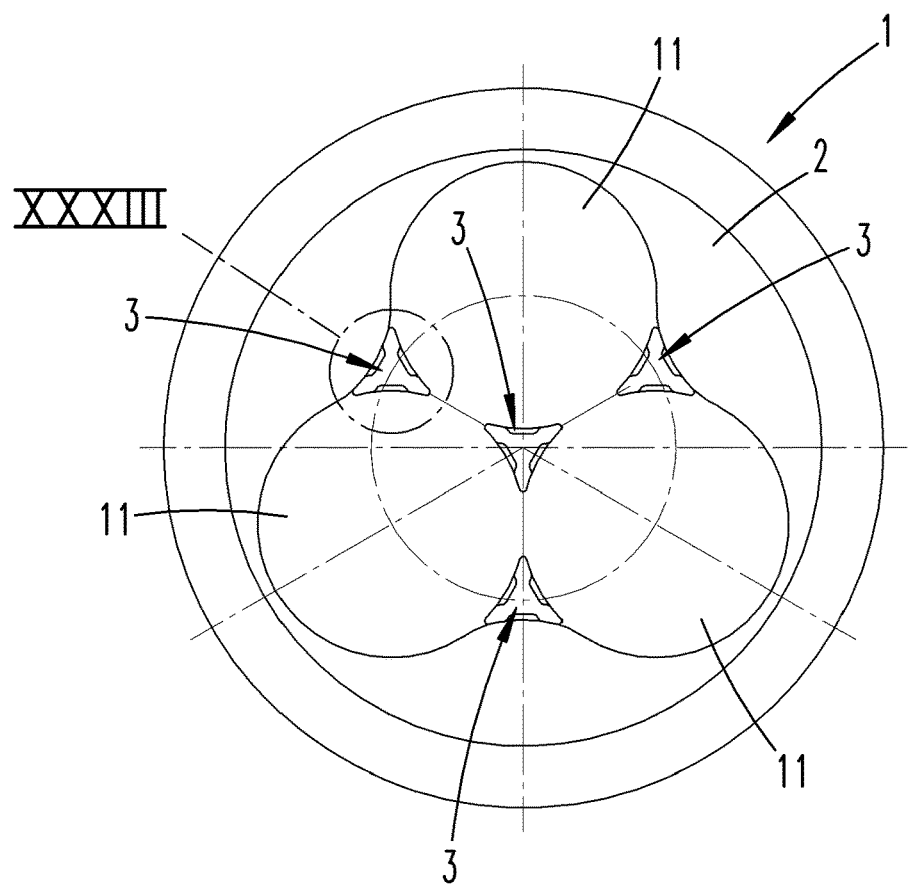
FIG. 31 shows a top view of a susceptor 1 according to a twenty-third exemplary embodiment.
Figure 32:
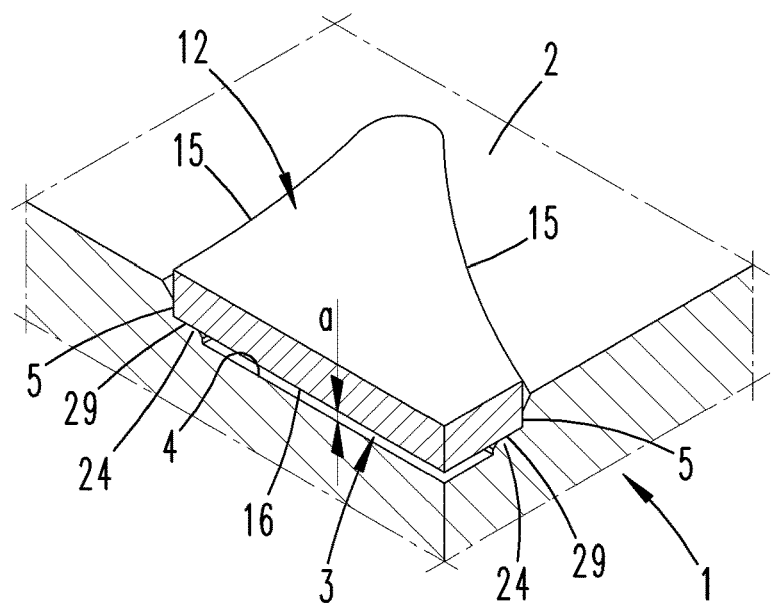
FIG. 32 shows the twenty-third exemplary embodiment in the form of a representation according to FIG. 1.
Figure 33:
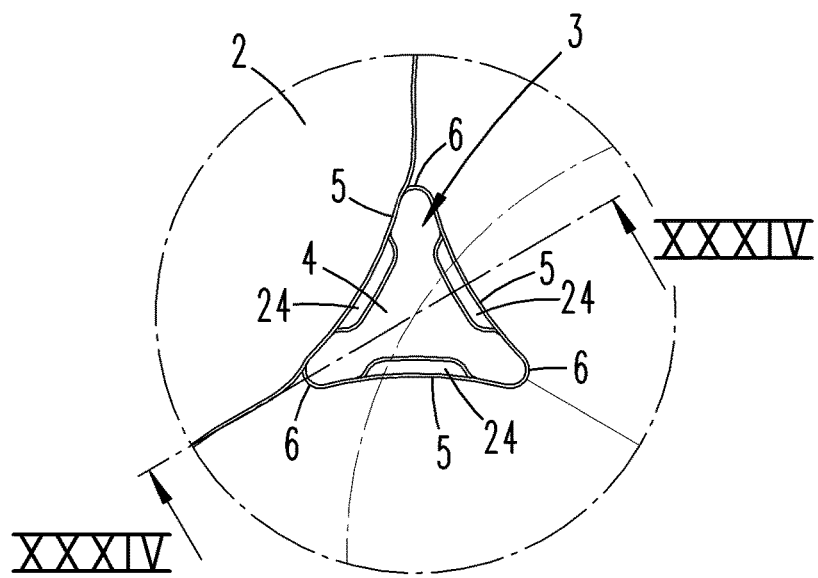
FIG. 33 shows the detail XXXIII in FIG. 31 in the form of an enlarged view.
Figure 34:
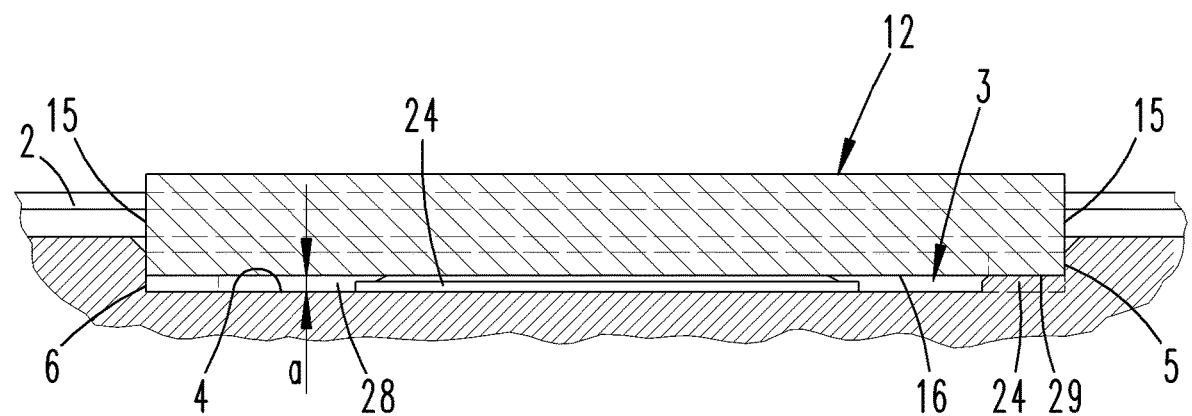
FIG. 34 shows a cross section along the line XXXIV-XXXIV in FIG. 33 with a positioning element 12 inserted into the insertion opening 3.

In the nineteenth exemplary embodiment illustrated in FIG. 27, the positioning flanks 15 extend on circular arc-shaped lines or similar lines and the outer edges of the insertion section 13 extend on secants to the positioning flanks 15. The edge undergrip sections 26 protruding from the insertion opening 3 respectively carry a rib 8, the apex area of which forms a carrying zone 27, wherein an edge section of the substrate 11 lies on said carrying zones. Projections 23 protrude from the underside of the positioning element 12 and support the positioning element 12 on the base surface 4 such that the above-described clearance a is formed.

The twentieth exemplary embodiment illustrated in FIG. 28 differs from the nineteenth exemplary embodiment in that the underside 16 of the insertion section 13 does not comprise projections, but rather essentially lies on the base surface 4 in surface contact. In not-shown variations, however, it is in this context also proposed that the base surface 4 comprises structural elements or the underside 16 comprises structure elements such that one or more hollow spaces are formed between the positioning element 12 and the susceptor, particularly between an underside 16 of the positioning element 12 and a base surface 4 of the insertion opening, wherein said hollow space or hollow spaces can accommodate a medium with lower thermal conductivity than the susceptor 1 or the positioning element 12.

In the twenty-first exemplary embodiment illustrated in FIG. 29, the edge of the substrate 11 lies on a planar carrying zone 27 in surface contact.

The twenty-second exemplary embodiment illustrated in FIG. 30 also comprises all elements of the nineteenth exemplary embodiment illustrated in FIG. 27. However, the projections 23 or the bearing projections 8 are respectively flanked by trenches in this case.

FIGS. 31-34 show a twenty-third exemplary embodiment of a susceptor. The susceptor 1 has an essentially circular outline and a planar bearing surface 2. The bearing surface 2 contains multiple insertion openings 3, particularly four insertion openings, into which a positioning element 12 can be respectively inserted in order to hold three substrates 11 in position on the bearing surface 2.

Figure 35:
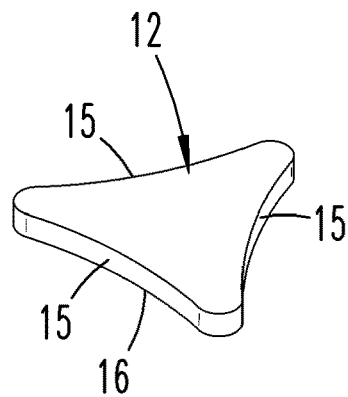
FIG. 35 shows the positioning element according to the twenty-third exemplary embodiment in the form of a perspective view.
Figure 36:
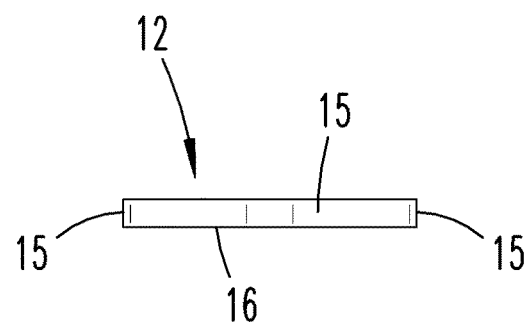
FIG. 36 shows a side view of the positioning element 12 illustrated in FIG. 35.
Figure 37:
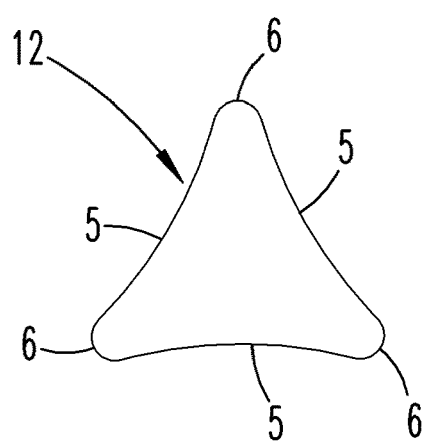
FIG. 37 shows a top view of the positioning element 12 illustrated in FIG. 35.

The positioning elements are illustrated in FIGS. 35-37. They consist of SiC and are realized in the form of a flat body.

The insertion opening 3 has a base 4 that extends parallel to the bearing surface 2. Steps respectively extend along the sidewalls 5 of the insertion opening 3 and form projections 24. The projections 24 have a carrying surface that respectively extends parallel to the surface of the base 4 or the bearing surface 2, wherein the underside 16 of the positioning element is supported on said carrying surface. The underside 16 forms a plane. The positioning element 12 lying in the insertion opening 3 is only supported on its edges and has a section that protrudes from the insertion opening 3 beyond the bearing surface 2 such that the substrates 11 can abut on the positioning flanks 15. The overall depth of the insertion opening 3 amounts to about 1200 μm. The height of the projection 24 amounts to about 200 μm such that the positioning element 12 penetrates into the insertion opening 3 by about 1 mm. The height of the projection 24 defines the height of the hollow space 28 being formed between the underside 16 and the base 4. The lateral boundaries of the hollow space 28 are defined by the walls of the insertion opening 3, which extend free of projections in the region of the rounded corners 6, and by the sidewalls of the projections 24, which extend along the curved sidewalls 5.

Figure 38:
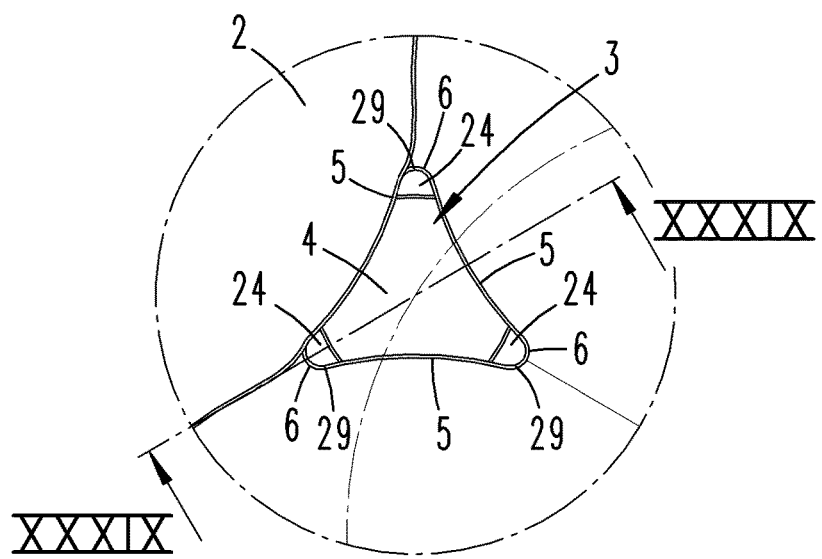
FIG. 38 shows a twenty-fourth exemplary embodiment in the form of a representation according to FIG. 33.
Figure 39:
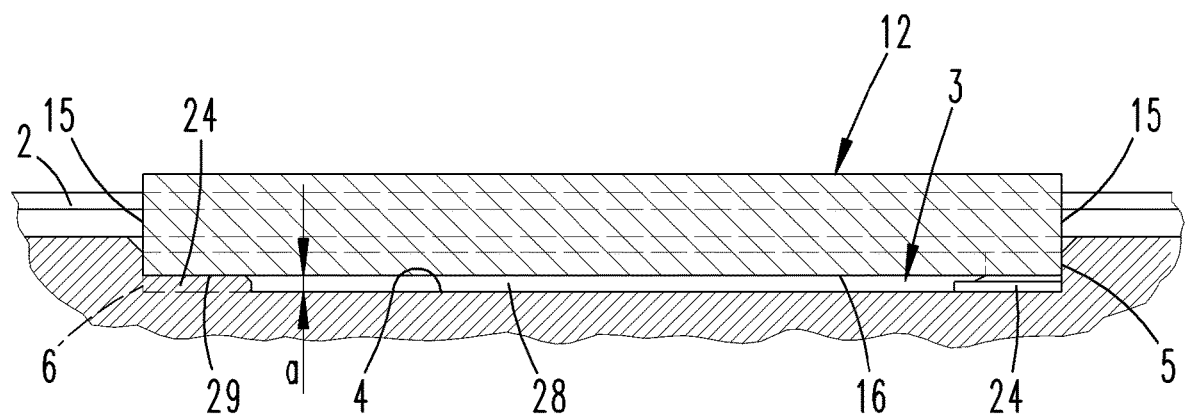
FIG. 39 shows a section along the line XXXIX-XXXIX in FIG. 38 with a positioning element 12 inserted into the insertion opening 3.

FIGS. 38 and 39 show a twenty-fourth exemplary embodiment. The susceptor may essentially have the same shape as the susceptor illustrated in FIG. 2 or 31. The positioning elements 12 inserted into the insertion openings 3 have the shape illustrated in FIGS. 35-37.

In contrast to the twenty-third exemplary embodiment, in which the positioning elements 12 are supported on the projections 24 with an edge region, the positioning elements 12 in the twenty-fourth exemplary embodiment are supported on projections 24 with their rounded corner regions. The projections 24 are arranged in the region of the rounded corners 6 in this case. A groove 29 extends between the walls 5 of the insertion opening 3 and the carrying surfaces formed by the projections 24. The carrying surfaces of the projections 24 extend in a common plane such that the underside 16 of the positioning element 12 is flatly supported on the projection 24—as it is also the case in the twenty-third exemplary embodiment. A hollow space arranged between the underside 16 and the base 4 is in this case also defined by the sidewalls of the projections 24 and the sidewalls of the insertion opening 3.

In the exemplary embodiments, the hollow space 28 may comprise an outward flow connection such that it is filled with a gas during the operation of a CVD reactor, in which the susceptor 1 is arranged. The hollow space 28 is also evacuated during the evacuation of the CVD reactor. In order to form the flow-through channel, the sidewalls of the positioning element 12 may be slightly spaced apart from the sidewalls of the insertion opening 3 such that a gap is formed. A gas exchange can take place through this gap.

In a variation, it is proposed that the hollow space 28 is filled with a material that has a different thermal conductivity than the susceptor 1 or the positioning element 12.

The preceding explanations serve for elucidating all inventions that are included in this application and respectively enhance the prior art independently with at least the following combinations of characteristics, namely:

A susceptor, characterized by a hollow space 28 formed in the region between the base 4 and the underside 16.

A susceptor, which is characterized in that the edge-protruding section 18 protrudes over the section 9, 6 of the bearing surface 2 with a clearance b other than zero such that a free space is formed.

A susceptor, which is characterized in that at least one supporting section of the underside 16 is supported on a carrying section of the base 4 and at least a section of the base 4 has a clearance a other than zero from a section of the underside 16.

A susceptor, which is characterized in that the supporting section is formed by the essentially planar underside 16 of the positioning element and the carrying section is formed by a projection 24 or a step 22 of the base 4 of the insertion opening 3.

A susceptor, characterized by a body 20 that is arranged between the base 4 and the underside 16 and consists of a material with different thermal conductivity.

A susceptor, which is characterized in that the hollow space 28 is arranged between the sidewalls 5 and projections 24 or steps 22 of the insertion opening 3 or between one or more inner walls 17" of the webs 17 forming the contact zones 17'.

A susceptor, which is characterized in that the insertion opening 3 has a polygonal outline, wherein the polygon corners are rounded.

A susceptor, characterized by one or more gaps 21, which are arranged between the one or more supporting sections or one or more carrying sections, or by sidewalls 5, which extend in a curvilinear or rectilinear manner in the plane of the bearing surface 2 and on which curvilinear or rectilinear contact flanks 17' formed by the contact zones abut.

A susceptor, which is characterized in that the webs 17 of the positioning element 12 are supported on the base 4.

A susceptor, which is characterized in that the positioning element 12 is supported on a step 22 or a projection 24 of the insertion opening 3.

A susceptor, which is characterized in that the base 4 has a planar base surface or a curved base surface.

A susceptor, which is characterized in that the underside 16 as a planar underside surface or a curved underside surface.

A susceptor, characterized by projections 23 that protrude from the underside 16, wherein the positioning element 12 is supported on the base 4 by means of said projections.

A susceptor, characterized by a pedestal 25 that protrudes from the underside 16 in the region between multiple webs 17.

A susceptor, which is characterized in that the outline of the insertion opening 3 is completely covered by an edge-protruding section 18 of the positioning element 12.

A susceptor, which is characterized in that edge undergrip sections 26 of the insertion section 13 protruding into the insertion opening 3 form carrying zones 27 for carrying an edge of the substrate 11.

A susceptor, which is characterized in that the carrying zones 27 comprise bearing projections 8, on which the edge of the substrate 11 lies.

All disclosed characteristics are essential to the invention (individually, but also in combination with one another). The disclosure content of the associated/attached priority documents (copy of the priority application) is hereby fully incorporated into the disclosure of this application, namely also for the purpose of integrating characteristics of these documents into claims of the present application. The characteristic features of the dependent claims characterize independent inventive enhancements of the prior art, particularly for submitting divisional applications on the basis of these claims.

LIST OF REFERENCE SYMBOLS

1 Susceptor
2 Bearing surface
3 Insertion opening
4 Base surface
5 Sidewall
6 Rounded corner
6' Edge section
7 Hollow space
8 Bearing projection/rib
9 Round edge 10 Base
11 Substrate
12 Positioning element
13 Insertion section
14 Positioning section
15 Positioning flank
16 Underside
17 Web
17' Contact flank/contact zone
17" Inner wall
18 Edge-protruding section
19 Rounded corner
20 Body
21 Gap
22 Step
23 Projection
24 Projection
25 Pedestal
26 Edge undergrip section
27 Carrying zone
28 Hollow space
29 Groove
a Clearance
b Clearance

What is claimed is:

1. A susceptor (1) for a chemical vapor deposition (CVD) reactor with insertion openings (3), which are arranged in a bearing surface (2) of the susceptor (1) and into each an insertion section (13) of a positioning element (12) is inserted, wherein a circular storage space is formed between the plurality of positioning elements (12),
wherein each of the positioning elements (12) forms positioning flanks (15) with a positioning section (14) that protrudes from a corresponding one of the insertion openings (3) in order to fix a position of a substrate (11) within the circular storage space,
wherein a first one of the insertion openings (3) has sidewalls (5) and a base (4),
wherein a first one of the insertion sections (13) comprises contact zones (17'), which abut on the sidewalls (5) of the first insertion opening (3),
wherein a first one of the positioning sections (14) comprises an underside (16) that faces the base (4) of the first insertion opening (3), and
wherein a hollow space (28) is formed between the base (4) of the first insertion opening (3) and the underside (16) of the first positioning section (14).

2. A susceptor (1) for a chemical vapor deposition (CVD) reactor with insertion openings (3), which are arranged in a bearing surface (2) of the susceptor (1) and into each an insertion section (13) of a positioning element (12) is inserted, wherein a circular storage space is formed between the plurality of positioning elements (12),
wherein each of said positioning elements (12) forms positioning flanks (15) with a positioning section (14) that protrudes from a corresponding one of the insertion openings (3) in order to fix a position of a substrate (11) within the circular storage space,
wherein a first one of the insertion openings (3) has sidewalls (5) and a base (4),
wherein a first one of the insertion sections (13) comprises contact zones (17'), which abut on the sidewalls (5) of the first insertion opening (3),
wherein a first one of the positioning sections (14) comprises an underside (16) that faces the base (4) of the first insertion opening (3),
wherein an edge-protruding section (18) of the first positioning section (14) protruding from the first insertion opening (3) forms at least one of the positioning flanks (15) and protrudes over a section (9, 6') of the bearing surface (2) bordering on an edge of the first insertion opening (3), and
wherein the edge-protruding section (18) protrudes over the section (9, 6') of the bearing surface (2) with a clearance (b) greater than zero such that a free space is formed.

3. The susceptor (1) of claim 1, wherein at least one section of the first positioning section (14) is supported on a carrying section of the base (4) of the first insertion opening (3) and at least a section of the base (4) has a clearance (a) greater than zero from a section of the underside (16) other than the at least one supporting section.

4. The susceptor (1) of claim 3, wherein the at least one section is formed by the underside (16) of the first positioning section (14) and the carrying section is formed by a projection (24) or a step (22) of the base (4) of the first insertion opening (3), wherein the underside (16) of the first positioning section (14) is planar.

5. The susceptor of claim 1, further comprising a body (20) that is arranged in the hollow space (28) between the base (4) of the inserting opening (3) and the underside (16) of the positioning section (14) and consists of a material with different thermal conductivity than the positioning element (12) or the susceptor (1).

6. The susceptor of claim 1, wherein the hollow space (28) is arranged between one or more inner walls (17") of webs (17) of the first positioning element (12) forming the contact zones (17').

7. The susceptor (1) of claim 1, wherein the first insertion opening (3) has a polygonal outline, and wherein corners of the polygonal outline are rounded.

8. The susceptor (1) of claim 1, further comprising one or more gaps (21), which are arranged between webs (17) of the first positioning section (14) or one or more carrying sections of the base (4) of the first insertion opening (3).

9. The susceptor (1) of claim 6, wherein the webs (17) of the first positioning element (12) are supported on the base (4) of the first insertion opening (3).

10. The susceptor (1) of claim 1, wherein the first positioning element (12) is supported on a step (22) or a projection (24) of the first insertion opening (3).

11. The susceptor (1) of claim 1, wherein the base (4) of the first insertion opening (3) has a planar base surface or a curved base surface.

12. The susceptor (1) of claim 1, wherein the underside (16) of the first positioning section (14) is a planar underside surface or a curved underside surface.

13. The susceptor of claim 1, further comprising projections (23) that protrude from the underside (16) of the positioning section (14), wherein the positioning element (12) is supported on the base (4) of the insertion opening (3) by means of said projections.

14. The susceptor (1) of claim 6, further comprising a pedestal (25) that protrudes from the underside (16) of the first positioning section (14) in a region between the webs (17) of the first positioning element (12).

15. The susceptor (1) of claim 1, wherein an outline of the first insertion opening (3) is completely covered by an edge-protruding section (18) of the first positioning element (12).

16. A susceptor (1) for a chemical vapor deposition (CVD) reactor with an insertion opening (3), which is arranged in a bearing surface (2) of the susceptor (1) and into which an insertion section (13) of a positioning element (12) is inserted, wherein said positioning element (12) forms positioning flanks (15) with a positioning section (14) that protrudes from the insertion opening (3), wherein a storage space for a first substrate (11) extends between multiple positioning elements (12), wherein the first substrate (11) and a second substrate (11) abut on the positioning flanks (15) of the positioning element (12), wherein the first substrate (11) is suspended above a first base (10) of the storage space extending between the positioning elements (12), wherein the insertion opening (3) has sidewalls (5) and a second base (4), wherein the insertion section (13) comprises contact zones (17'), which abut on the sidewalls (5) of the insertion opening (3), wherein the positioning section (14) comprises an underside (16) that faces the base (4) of the insertion opening (3), and wherein edge undergrip sections (26) of the insertion section (13) protruding into the insertion opening (3) form carrying zones (27) for carrying an edge of the first substrate (11).

17. The susceptor of claim 16, wherein the carrying zones (27) comprise bearing projections (8), on which the edge of the first substrate (11) lies.

18. The susceptor (1) of claim 1, wherein the sidewalls (5) of the first insertion opening (3) extend in a curvilinear or rectilinear manner in a plane of the bearing surface (2) and abut curvilinear or rectilinear contact zones (17') of the first insertion section (13).

* * * * *